US008724821B2

(12) United States Patent
Ohashi

(10) Patent No.: US 8,724,821 B2
(45) Date of Patent: May 13, 2014

(54) SOUND FIELD CONTROLLER

(75) Inventor: Noriyuki Ohashi, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 368 days.

(21) Appl. No.: 13/053,698

(22) Filed: Mar. 22, 2011

(65) Prior Publication Data

US 2011/0243342 A1 Oct. 6, 2011

(30) Foreign Application Priority Data

Mar. 31, 2010 (JP) ................................ 2010-082404

(51) Int. Cl.
*H04R 29/00* (2006.01)
*H03G 3/00* (2006.01)
*H04R 5/02* (2006.01)

(52) U.S. Cl.
USPC .................. 381/63; 381/61; 381/59; 381/303

(58) Field of Classification Search
CPC ............. H04S 7/00; H04S 7/30; H04S 7/301; H04S 7/305; H04S 7/308; H04R 29/00; H04R 2227/007; G01H 7/00; G10H 2210/265; G10H 2210/281; G10H 2210/291; G10H 2210/295; G10H 2210/301; G10H 2250/531; G10K 15/08
USPC ............................ 381/56, 58, 59, 61, 63, 303
See application file for complete search history.

(56) References Cited

U.S. PATENT DOCUMENTS 5,144,673 A * 9/1992 Matsumoto et al. ............ 381/61
5,680,464 A 10/1997 Iwamatsu
5,742,688 A * 4/1998 Ogawa et al. .................. 381/17
6,909,041 B2 6/2005 Ohta
2005/0195984 A1* 9/2005 Miura et al. .................... 381/63
2007/0253564 A1* 11/2007 Katayama et al. .............. 381/63

FOREIGN PATENT DOCUMENTS

JP 2-309800 A 12/1990
JP 4-225400 A 8/1992
JP 5-49099 A 2/1993
JP 8-272387 A 10/1996
JP 2755208 B2 5/1998
JP 2003-255955 A 9/2003
JP 2005-252467 A 9/2005
JP 2007-300403 A 11/2007

OTHER PUBLICATIONS

Japanese Office Action with English translation dated Feb. 25, 2014 (seven (7) pages).

* cited by examiner

*Primary Examiner* — Davetta W Goins
*Assistant Examiner* — Daniel Sellers
(74) *Attorney, Agent, or Firm* — Crowell & Moring LLP

(57) ABSTRACT

A sound field controller includes: a sound field generation section which generates an effect sound signal for giving a sound field effect sound to an audio signal; an acquisition section which acquires a measurement signal indicating sound pressure levels of a direct sound and a reflected sound which are collected when a test sound is emitted in a reproduction environment; an identification section which identifies a maximum reflected sound whose sound pressure level is the maximum in a given time period after a collecting timing of the direct sound from the measurement signal; an adjustment section which adjusts the effect sound signal based on a ratio of the sound pressure level of the direct sound to the sound pressure level of the maximum reflected sound; and an output section which outputs the audio signal input to the input section and the effect sound signal adjusted by the adjustment section.

9 Claims, 2 Drawing Sheets

SOUND FIELD CONTROLLER

BACKGROUND OF INVENTION

1. Technical Field

The present invention relates to an art for giving a sound field effect responsive to a reproduction environment.

2. Background Art

Some AV amplifiers have a function of giving a sound field effect based on a specific virtual sound source distribution. The sound field effect mentioned here is the effect of giving a listener presence as if the listener were in a movie theater or a concert hall while he or she is at home, for example, and is realized by giving a reverberant sound, etc (for example, refer to Japanese Patent No. 2755208). That is, the sound field effect attempts to give the listener a sense as if he or she were in another reproduction environment while he or she is in one reproduction environment.

Such a sound field effect is set with a predetermined ideal reproduction environment as the reference. In reality, however, it is very difficult to make the actual reproduction environment of a listener be the same as the reference reproduction environment. In the reproduction environment of the listener, there is a possibility that the sound field effect may be produced too strong or too weak as compared with presumed sound field effect.

SUMMARY OF INVENTION

It is an object of the invention to make it possible to adjust the sound field effect in response to any reproduction environments.

A sound field controller according to an aspect of the invention includes: an input section to which an audio signal is input; a sound field generation section which generates an effect sound signal for giving a sound field effect sound to the audio signal; an acquisition section which acquires a measurement signal indicating sound pressure levels of a direct sound and a reflected sound which are collected when a test sound is emitted in a reproduction environment; an identification section which identifies a maximum reflected sound whose sound pressure level is the maximum in a given time period after a collecting timing of the direct sound from the measurement signal acquired by the acquisition section; an adjustment section which adjusts the effect sound signal generated by the sound field generation section based on a ratio of the sound pressure level of the direct sound to the sound pressure level of the maximum reflected sound; and an output section which outputs the audio signal input to the input section and the effect sound signal adjusted by the adjustment section.

The sound field controller according to the aspect of the invention may be configured in that the identification section identifies a plurality of reflected sounds including the maximum reflected sound and one or more reflected sounds whose sound pressure level is the second largest in the given time period, and the adjustment section adjusts the effect sound signal using the sound pressure levels of the plurality of reflected sounds identified by the identification section in combination.

The sound field controller according to the aspect of the invention may be configured in that when the ratio is regarded as a first coefficient and a sound pressure level ratio between a direct sound and a reflected sound collected or assumed in another reproduction environment which differs from the reproduction environment is regarded as a second coefficient, the adjustment section adjusts the effect sound signal using a ratio of the second coefficient to the first coefficient.

The sound field controller according to the aspect of the invention may be configured by further including a setting section for setting the time period.

The sound field controller according to the aspect of the invention may be configured in that the identification section identifies the maximum reflected sound in a first time period after an elapse of a second time period from the collecting timing of the direct sound.

The sound field controller according to the aspect of the invention may be configured in that the identification section identifies the maximum reflected sound from, except for primary reflected sounds, secondary or subsequent reflected sounds contained in the measurement signal acquired by the acquisition section.

According to the invention, it is made possible to adjust the sound field effect in response to any reproduction environments.

DETAILED DESCRIPTION OF EXEMPLARY EMBODIMENTS (Embodiment)

Figure 1:
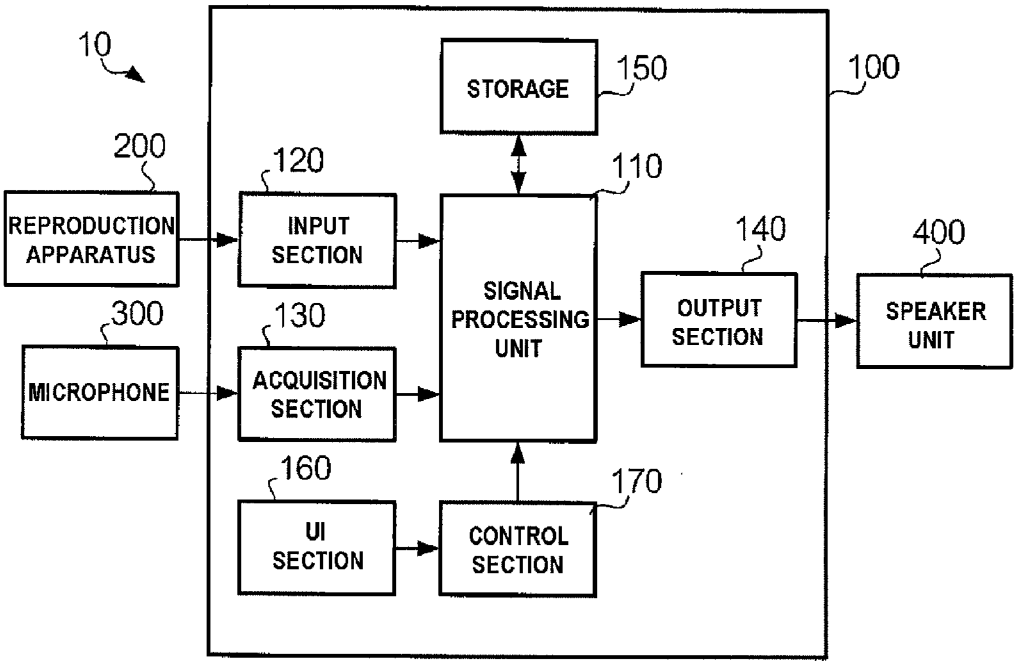
FIG. 1 is a block diagram to show the configuration of an audio system.

FIG. 1 is a block diagram to show the configuration of an audio system according to one embodiment of the invention. As shown in FIG. 1, an audio system 10 of the embodiment includes a sound field controller 100, a reproduction apparatus 200, a microphone 300, and a speaker unit 400.

The audio system 10 is used in a reproduction environment for one listener. The reproduction environment refers to an environment in which a sound is reproduced. The reproduction environment represents the acoustic characteristics of one space and changes by receiving the effects of substances separating the space from other spaces (walls, a floor, a ceiling, etc.,) and substances existing in the space (furniture, curtains, etc.,). It can be said that the substances are components of the reproduction environment. The reproduction environment typically is a room (a listening room) for the listener to listen and view music and a movie.

The reproduction apparatus 200 supplies an audio signal representing a sound to the sound field controller 100. The audio signal supplied by the reproduction apparatus 200 to the sound field controller 100 will be hereinafter referred to as "input signal." The reproduction apparatus 200 is, for example, a DVD (Digital Versatile Disc) player or a tuner. The reproduction apparatus 200 may reproduce video as well as a sound. However, the description on reproduction of the video is omitted.

The microphone 300 collects a sound at a predetermined position in a reproduction environment for a listener. The position at which the microphone 300 collects a sound will be hereinafter referred to as "sound reception point." Preferably, the sound reception point matches the position of the listener when he or she listens to music, etc. The microphone 300 supplies a measurement signal representing a sound collected at the sound reception point to the sound field controller 100. The measurement signal is an audio signal used to give the sound field effect responsive to the reproduction environment for the listener.

The speaker unit 400 emits a sound responsive to an audio signal output by the sound field controller 100 (hereinafter, referred to as "output signal"). The speaker unit 400 includes a speaker installed at any position of the reproduction environment for the listener. The speaker unit 400 can include a plurality of speakers at different installation positions. In this case, any placement of the speakers may be fine if it is previously determined.

The sound field controller 100 executes various types of signal processing for an input signal input by the reproduction apparatus 200 and outputs an output signal to the speaker unit 400. The signal processing executed by the sound field controller 100 contains at least processing of giving the sound field effect responsive to the reproduction environment for the listener with respect to the input signal. The sound field effect of the sound field controller 100 is given with a predetermined reproduction environment which differs from the reproduction environment for the listener as a reference and is characterized in that an adjustment responsive to the reproduction environment for the listener is made. The reproduction environment as the reference is a reproduction environment designed by the manufacturer, etc., and generally is a reproduction environment of comparatively small reverberation. The sound field controller 100 identifies the mode of the adjustment using a measurement signal input by the microphone 300. To realize this, the sound field controller 100 includes a signal processing unit 110, an input section 120, an acquisition section 130, an output section 140, a storage 150, a UI (User Interface) section 160, and a control section 170.

The input section 120 accepts input of the input signal supplied from the reproduction apparatus 200. The input section 120 may execute processing of A/D conversion (analog-to-digital conversion), decoding, etc., in response to the input signal. The input section 120 supplies the processed input signal to the signal processing unit 110.

The acquisition section 130 accepts input of the measurement signal supplied by the microphone 300 and supplies the measurement signal to the signal processing unit 110. The acquisition section 130 may also execute processing similar to that by the input section 120 as required.

The acquisition section 130 may be any configuration if it can acquire the measurement signal and is not limited to the configuration in which the acquisition section 130 is connected directly to the microphone 300. For example, if a previously recorded (collected) measurement signal in the reproduction environment for the listener is obtained from a storage (a memory card, etc.), the acquisition section 130 may be a drive unit for reading the measurement signal from the storage.

The signal processing unit 110 executes signal processing for giving the sound field effect responsive to the reproduction environment for the listener with respect to the input signal based on the input signal supplied by the input section 120 and the measurement signal supplied by the acquisition section 130. The main processing executed by the signal processing unit 110 is divided into four types of processing. The processing includes first processing of producing a test sound to obtain the measurement signal, second processing of analyzing the measurement signal obtained by executing the first processing, third processing of generating an effect sound signal for giving the sound field effect based on the input signal, and fourth processing of adjusting the effect sound signal generated by executing the third processing in response to the analysis result of the second processing. The signal processing unit 110 executes these types of processing, adds and outputs the input signal and the (adjusted) effect sound signal. The signal processing unit 110 is implemented as a DSP (Digital Signal Processor), for example.

The output section 140 outputs the input signal supplied by the input section 120 and the effect sound signal supplied by the signal processing unit 110. The output section 140 may perform delay, mixing, D/A conversion (digital-to-analog conversion), amplification, etc. with respect to the signal, before supplying the audio signal to the speaker unit 400. The output section 140 may output the audio signal to any other means (for example, to a storage) in place of the speaker unit 400.

In the storage 150 is stored data used when the signal processing unit 110 executes signal processing. The storage 150 includes a nonvolatile storage of flash memory, etc., for example. The storage 150 memorizes coefficients 'a' and 'b' described later, effect sound information for generating a sound field effect sound, and the like. The coefficient 'a' is previously stored in the storage 150; the coefficient 'b' is stored in the storage 150 as the signal processing unit 110 executes an analysis.

The UI section 160 accepts operation by a listener. The UI section 160 includes buttons or switches for accepting operation by the listener and supplies an operation signal responsive to the accepted operation to the control section 170. The operation of a user can contain a measurement command of a test sound and selection of the type (mode) of sound field effect. The UI section 160 may have means for receiving an operation signal from a remote controller wirelessly. The UI section 160 may further include a display of a liquid crystal display, etc., to present various pieces of information to the listener and aid in the operation by the listener.

The control section 170 controls the operation of the signal processing unit 110. The control section 170 causes the signal processing unit 110 to execute predetermined processing in response to the operation by the listener accepted through the UI section 160, for example. The control section 170 is implemented as a CPU (Central Processing Unit), for example.

Figure 2:
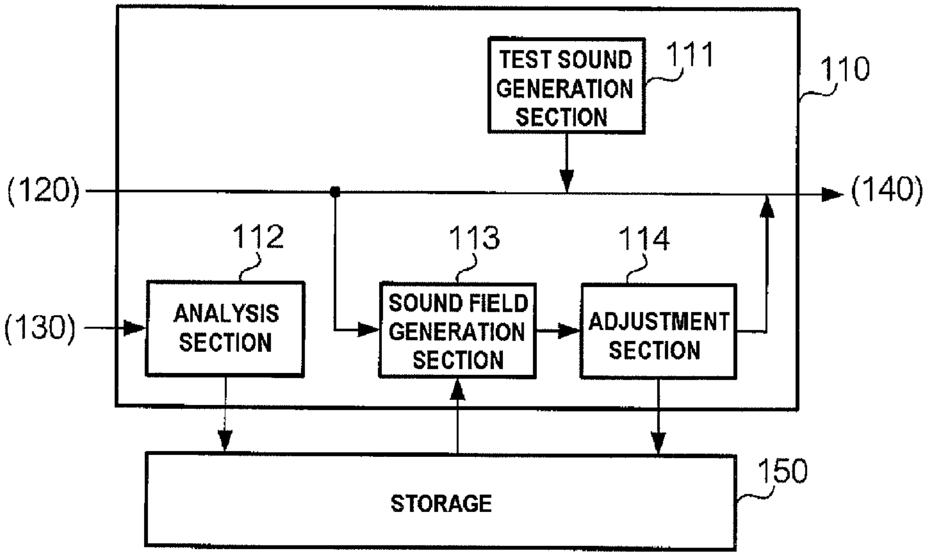
FIG. 2 is a block diagram to show the configuration of a signal processing unit in more detail.

FIG. 2 is a block diagram to show the configuration of the signal processing unit 110 in more detail. As shown in FIG. 2, the signal processing unit 110 includes a test sound generation section 111, an analysis section 112, a sound field generation section 113, and an adjustment section 114.

The test sound generation section 111 corresponds to the first processing described above and generates a test sound. The test sound generation section 111 supplies an audio signal representing the test sound (hereinafter referred to as "test sound signal") in response to operation by the listener. In the embodiment, the test sound is an impulse sound (a sound with short duration as much as possible) whose sound pressure level is predetermined.

The analysis section 112 corresponds to the second processing described above and analyzes a sound (hereinafter referred to as "measurement sound") provided by collecting the produced test sound. The analysis section 112 corresponds to an example of an identification section according to the invention. The analysis section 112 acquires a measurement signal representing a measurement sound and analyzes a response of a reproduction environment in response to the test sound. Specifically, the analysis section 112 first identifies a direct sound and its sound pressure level for the test sound based on the sound pressure level of the measurement sound represented by the measurement signal. Next, the analysis section 112 identifies a time period (hereinafter referred to as "search time period") for searching for a reflected sound in response to a sound collection timing of the direct sound and identifies the reflected sound (also referred to as "maximum reflected sound") whose sound pressure level is the maximum in the search time period. Further, the analysis section 112 calculates a ratio of the sound pressure level of the reflected sound identified in the search time period with respect to the sound pressure level of the direct sound and stores the ratio in the storage 150 as a coefficient of adjustment by the adjustment section 114. Hereinafter, the coefficient calculated by the analysis section 112 at the time will be referred to as 'b.' The coefficient 'b' corresponds to an example of a first coefficient according to the invention.

The direct sound refers to a sound collected without being reflected by any components of the reproduction environment (wall, etc.,) among the measurement sound. The reflected sound refers to a sound collected as it is reflected by the components of the reproduction environment among the measurement sound. In other words, it can also be said that the reflected sound is any other sound than the direct sound in the sound collection result of the test sound. The reflected sound is also called indirect sound in a sense that arrival of the sound is indirect rather than direct. This means that the reflected sound arrives and is collected later than the direct sound.

Figure 3:
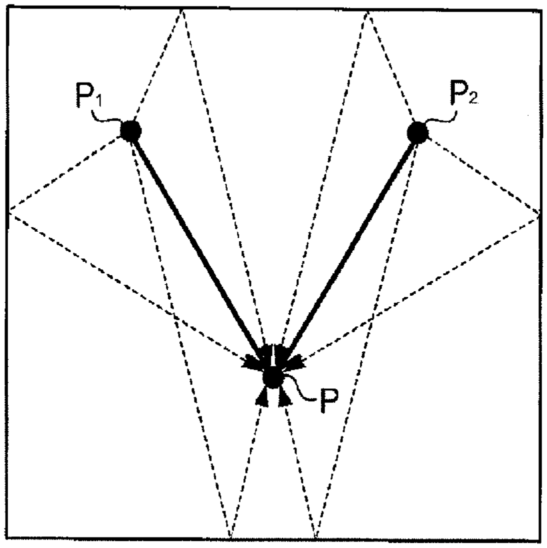
FIG. 3 describes the direct sounds and the reflected sounds.

FIG. 3 describes the direct sounds and the reflected sounds and is a schematic view to show a reproduction environment surrounded by square walls from above. In FIG. 3, it is assumed that a point P is the sound reception point. It is assumed that points $P_1$ and $P_2$ are positions where the speakers are installed. Each direct sound is directed from the points $P_1$ and $P_2$ toward the sound reception point P and arrives as indicated by solid-line arrows in the figure. This means that the direct sounds are sounds arriving earliest at the sound reception point P among sounds produced from the points $P_1$ and $P_2$ and collected at the sound reception point P. On the other hand, the reflected sounds are sounds once reflected on the components of the reproduction environment and then arriving at the sound reception point P as indicated by dashed-line arrows in the figure.

The reflected sounds are not limited to those shown in FIG. 3 and in fact, an infinite number of reflected sounds exist. The reflected sounds contain not only those reflected on the walls, but also those reflected on a ceiling and a floor. Further, the reflected sounds also contain sounds reflected on the components of the reproduction environment more than once.

In the embodiment, the search time is a time period beginning in 15 ms (milliseconds) from the timing at which the direct sound is collected and ending in 50 ms. The search time period is identified totally considering the following elements:

First, to distinguish two different sounds from each other, the auditory sense of a human being requires a time difference of about at least 30 ms in each sound. This means that when two sounds are produced at extremely short time intervals, the human being cannot precisely distinguish them from each other. Therefore, the search time period in the embodiment does not contain the time just after the collecting timing of the direct sound to exclude the time period over which the direct sound cannot be distinguished from any other sound aurally.

Second, generally an initial reflected sound in a room is about 50 to 100 ms from the collection of the direct sound. As the later reflected sounds, namely, the late reverberant sound, a large number of repeatedly reflected sounds are complicatedly mixed, the effect of attenuation accompanying reflection is received, the sound pressure level is small, and time change is flat. Thus, generally, unlike the initial reflected sound, the sounds cannot be distinguished from each other. Therefore, in the search time in the embodiment, the proper end time is identified to exclude the late reverberant sound from a specific target.

Third, as reflected sounds just after the direct sound, primary reflected sounds (once reflected sounds) are dominant. The primary reflected sounds well represent the feature of the reproduction environment, but the sound pressure level difference between the sounds (caused by the difference of reflecting structures) is also noticeable and largely changes up and down for each sound. If the reflected sound is prominently larger sound than other reflected sounds, it cannot be said that the reflected sound represents the feature as the whole of the reproduction environment. Then, the search time period in the embodiment does not contain the time just after the collecting timing of the direct sound to lessen the effect of the reflected sound on the identification result.

Fourth, to give a sound field effect sound, a delay set to start reproduction of the reflected sound is 15 to 35 ms in many modes. The sound field effect sound reproduced in the time period of several ten ms from the time well represents the given effect and reflection in the reproduction environment of the direct sound occurring at the time has a large effect on the sound field effect. Therefore, the time period after 15 to 35 ms is contained in the search time period. The search time period in the embodiment is determined totally considering such general facts empirically obtained.

The analysis section 112 can also vary the search time period in response to operation by the listener, etc. For example, if there are sound field effect modes that can be given by the sound field controller 100, the analysis section 112 may set each search time period responsive to the mode. The time periods of the initial reflection and the late reverberation are estimated based on information of the size of the space of the reproduction environment, the distance between the speaker and a listener, etc., whereby the search time more optimized for the listening environment can also be identified. In so doing, the analysis section 112 can realize a setting section according to the invention. In this case, the analysis section 112 may shift only the timing without changing the length of the search time period or may change the length of the search time period.

The sound field generation section 113 corresponds to the third processing described above and generates an effect sound signal based on the input signal. The sound field generation section 113 generates the effect sound signal using effect sound information stored in the storage 150. If a plurality of modes of sound field effect exist, the storage 150 memorizes effect sound information corresponding to each mode. In this case, the sound field generation section 113 reads the effect sound information responsive to the mode selected by the listener from the storage 150 and generates the effect sound signal. The sound field generation section 113 executes a delay, volume adjustment, etc., to realize a virtual sound source as required, for example, thereby realizing various sound field effects. The effect sound information is previously determined based on the reference reproduction environment.

The adjustment section 114 corresponds to the fourth processing described above and adjusts the effect sound signal generated by the sound field generation section 113 in response to the analysis result of the analysis section 112. The adjustment section 114 makes an adjustment using the coefficients 'a' and 'b' stored in the storage 150. Specifically, the adjustment section 114 uses the square root of the ratio of the coefficient 'a' to the coefficient 'b' (a/b) and executes processing of adjusting the effect sound signal with the adjustment amount responsive to the adjustment coefficient.

The coefficient ‘b’ is the ratio of the sound pressure level of the direct sound to the sound pressure level of the reflected sound identified in the search time period as described above. That is, the coefficient ‘b’ is a value changing in response to the actual reproduction environment for the listener and satisfies 1<b. On the other hand, the coefficient ‘a’ is a value provided by finding a similar ratio in the reference reproduction environment and represents the ratio of the sound pressure level of direct sound to the maximum sound pressure level of reflected sound in the reference reproduction environment. The coefficient ‘a’ may be found by actually generating a test sound in the reference reproduction environment and analyzing a measurement sound collecting the test sound or may be determined by an assumed value of the sound pressure level obtained by simulation, etc. The coefficient is a value satisfying 1<a.

The configuration of the audio system 10 is as follows: The listener uses the audio system 10 of the configuration in a predetermined reproduction environment and views and listens to content (movie, music, etc.,) reproduced by the reproduction apparatus 200. Before viewing and listening to the content, the listener (viewer) performs predetermined operation, thereby causing the audio system 10 to produce and collect a test sound. At this time, the listener installs the microphone 300 at the sound reception point and causes the sound field controller 100 to generate the test sound. The sound field controller 100 generates a test sound signal in response to the operation by the listener and causes the speaker unit 400 to produce the test sound. The sound field controller 100 acquires a measurement signal obtained by collecting the test sound thus produced from the microphone 300 and calculates the coefficient ‘b.’ Collecting and producing the test sound may be performed once if the reproduction environment does not change. Therefore, the listener need not perform the operation whenever he or she listens to (or views) the content.

Figure 4:
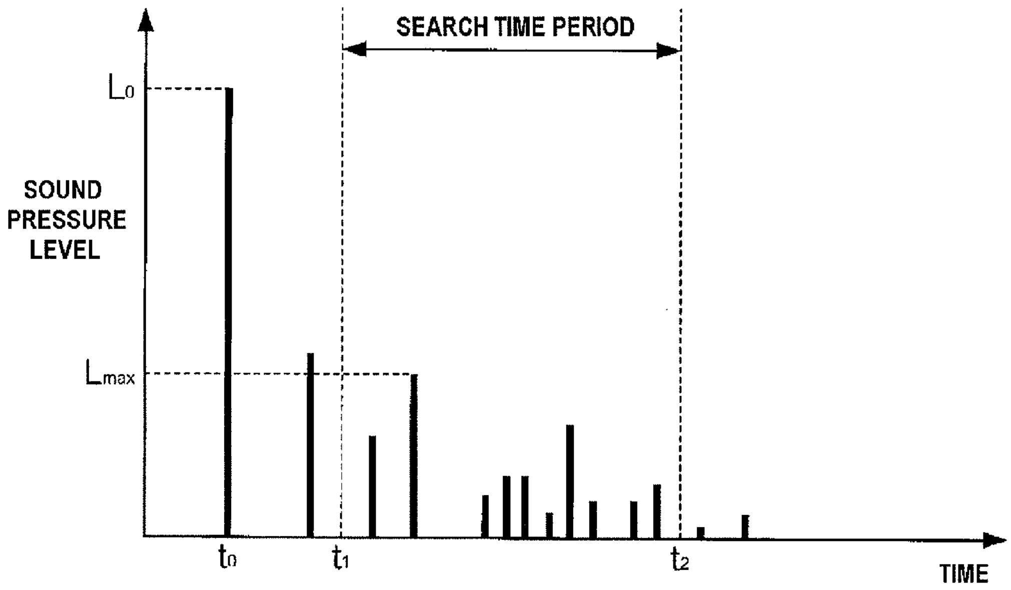
FIG. 4 shows an example of a measurement signal.

FIG. 4 shows an example of the measurement signal. In FIG. 4, the vertical axis represents the sound pressure level and the horizontal axis represents a time. In the example, it is assumed that the signal appearing at time to is the signal corresponding to a direct sound and time $t_1$ to $t_2$ is the search time period.

If such a measurement signal is acquired, the sound field controller 100 identifies the sound pressure level which becomes the maximum within the search time period, and calculates the coefficient ‘b.’ For example, if the sound pressure level of direction sound is $L_0$ and the sound pressure level of identified reflection sound is $L_{max}$, the coefficient ‘b’ is $L_0/L_{max}$.

The sound field controller 100 does not consider the sound pressure level of reflected sound outside the search time period. Therefore, the sound field controller 100 need not compare the sound pressure level about the measurement signal after the search time period. In other words, the analysis section 112 need not analyze the measurement signal after the termination of the search time period. If a larger value than $L_{max}$ described above is a measurement signal outside the search time period, the sound field controller 100 need not consider the value (signal) in calculation of the coefficient ‘b.’

When thus calculating the coefficient ‘b’ and storing it in the storage 150, the sound field controller 100 uses the coefficient ‘b’ to adjust the sound field effect sound. The adjustment coefficient is the square root of a/b. Therefore, if the coefficient ‘a’ is constant, the sound field controller 100 adjusts the sound so as to strengthen (increase) the sound field effect sound as the coefficient ‘b’ is smaller, and so as to weaken (lessen) the sound field effect sound as the coefficient ‘b’ is larger. If the sound pressure level $L_0$ of direct sound is constant, the coefficient ‘b’ becomes smaller value as the sound pressure level $L_{max}$ of reflected sound is larger. Therefore, adjustment made by the sound field controller 100 acts in a direction of strengthening the sound field effect sound as the reflected sound in the reproduction environment of the listener is larger.

As described above, adjustment made by the sound field controller 100 changes in response to the magnitude (sound pressure level) of the reflected sound in the reproduction environment of the listener, and strengthens action of adjustment as the reflected sound is larger. That is, adjustment made by the sound field controller 100 converts how much the reflected sounds in the reproduction environment for the listener hinder giving the sound field effect into a numeric value and if the degree of the hindrance is large, makes the sound field effect sound larger. Such adjustment enables the listener to listen to the sound field effect sound as much as the degree of hindrance against the sound field effect.

MODIFIED EXAMPLES

The invention is not limited to the embodiment described above and can also be carried out in other modes illustrated below. The invention can also be carried out by combining the following modified examples:

Modified Example 1

The analysis section 112 may identify a plurality of reflected sounds containing the sound whose sound pressure level is the maximum. That is, the analysis section 112 may identify one or more reflected sounds whose sound pressure level is larger than others in the search time period. For example, to identify the reflected sound whose sound pressure level is the maximum and one reflected sound whose sound pressure level is the second largest (namely, to identify two reflected sounds), the analysis section 112 may identify them from one search time period or the search time period may be divided into two time periods and the analysis section 112 may identify the reflected sound whose sound pressure level is the maximum from each of the division time periods. In so doing, if a reflected sound prominently larger sound than other reflected sounds exists in the search time period, it is made possible to lessen the action of (excessive) adjustment based on the reflected sound. When the search time period is divided into two time periods, the time periods may be discontinuous.

To identify a plurality of reflected sounds, the analysis section 112 uses the sound pressure levels of the identified reflected sounds in combination to calculate the coefficient ‘b.’ The adjustment section 114 uses the coefficient ‘b’ calculated by thus combining for adjustment of the effect sound signal. A method of combining the coefficients ‘b’ can be, for example, a method of averaging a plurality of coefficients ‘b’ to form one value or a method of calculating the ratio (a/b) for each of the coefficients ‘b’ and averaging the calculated ratios to form one value. The average may be any of arithmetic mean, geometric average, or generalized average (root mean square, etc.,).

Weight average may be used for the method of combining the coefficients ‘b.’ In this case, considering attenuation of energy (acoustic energy) accompanying reflection, larger weight may be given to a reflected sound collected with a delay from a direct sound or weight may be given in response to the magnitude of the sound pressure level of each reflected sound independently of the sound collection time.

Modified Example 2

The test sound according to the invention is not limited to an impulse sound if an impulse response is obtained as a measurement signal. For example, the test sound signal may be a TSP (Time Stretched Pulse) signal, a chirp signal, an M series signal, etc. To use such a signal as the test sound signal, if the analysis section 112 first executes processing of calculating an impulse response from a measurement signal and identifies the sound pressure levels of direct sound and reflected sound based on the impulse response, a similar analysis to that of the embodiment described above can be made.

Modified Example 3

In the embodiment described above, adjustment coefficient, namely, the square root of the ratio of the coefficient 'a' to the coefficient 'b' (a/b) can be any value of 0 or more. Thus, the adjustment coefficient may become an extremely large value or an extremely small value in some cases. Then, there is a possibility that adjustment of the sound field effect may be too strong or too weak. When adjusting the effect sound signal, the adjustment section 114 may provide the upper limit or the lower limit for the value of the adjustment coefficient. In so doing, the range of adjustment of the sound field effect can be limited and imbalance of the volume of the effect sound signal to the input signal can be suppressed.

Modified Example 4

The invention can be applied to a reproduction apparatus of multiple channels. The number of channels (namely, the number of speakers) in the reference reproduction environment need not be the same as the number of channels in the actual reproduction environment. For example, the number of channels in the reference reproduction environment may be "five" and the number of channels in the actual reproduction environment may be "four." In such a case, the coefficient 'a' may be a different value for each speaker, namely, for each channel in the reference reproduction environment. Likewise, the coefficient 'b' may also be a different value for each channel in the actual reproduction environment.

If a plurality of coefficients 'a' or a plurality of coefficients 'b' exist, the adjustment section 114 may make an adjustment using coefficients responsive to the channels, but may calculate the representative value of the coefficients 'a' or 'b' and may use the same value for the channels. The representative value is, for example, an average value or a center value. The adjustment section 114 may calculate the adjustment coefficient using the representative value of the coefficients 'a' or 'b' and using the value of each of other coefficients for each channel. The control section 170 rather than the adjustment section 114 may calculate the representative value by reading the coefficients 'a' and 'b' from the storage 150.

For example, if the number of channels in the reference reproduction environment is "five" and the number of channels in the actual reproduction environment is "four" as described above, the adjustment section 114 may calculate one representative value from five coefficients 'a' and may divide the representative value by four coefficients 'b,' thereby calculating the adjustment coefficient for each channel responsive to the actual reproduction environment. When the number of channels in the actual reproduction environment is "four," if right and left speakers exist on the front side of a listener and right and left speakers exist on the rear side of the listener and the speakers are placed as bilateral symmetry, the adjustment section 114 can also calculate the adjustment coefficient using the same coefficients 'a' and 'b' for the right and left speakers on the front side and using the same coefficients 'a' and 'b' (different from those on the front side) for the right and left speakers on the rear side.

Modified Example 5

The adjustment section 114 may be at the preceding stage of the sound field generation section 113 rather than the following stage. In this case, the adjustment section 114 previously adjusts an input signal input to the sound generation section 113, whereby consequently an effect sound signal output from the sound generation section 113 can be adjusted. For example, in multiple channels as in Modified Example 3 described above, if the representative value is used for both the coefficients 'a' and 'b,' the adjustment section 114 can be provided at the preceding stage of the sound field generation section 113.

Modified Example 6

Some or all of the sound field controller according to the invention can also be implemented as software. For example, the configuration corresponding to the analysis section may be implemented as CPU, namely, one function of the control section 170 rather than DSP.

What is claimed is:

1. A sound field controller, comprising:

an input section to which an audio signal is input;

a sound field generation section which generates an effect sound signal for giving a sound field effect sound to the audio signal;

an acquisition section which acquires a measurement signal indicating sound pressure levels of a direct sound and a reflected sound which are collected when a test sound is emitted in a reproduction environment;

an identification section which identifies a maximum reflected sound whose sound pressure level is the maximum in a given time period after a collecting timing of the direct sound from the measurement signal acquired by the acquisition section;

an adjustment section which adjusts the effect sound signal generated by the sound field generation section based on a ratio of the sound pressure level of the direct sound to the sound pressure level of the maximum reflected sound; and an output section which outputs the audio signal input to the input section and the effect sound signal adjusted by the adjustment section.

2. The sound field controller as claimed in claim 1, wherein the identification section identifies a plurality of reflected sounds including the maximum reflected sound and one or more reflected sounds whose sound pressure level is the second largest in the given time period, and the adjustment section adjusts the effect sound signal using the sound pressure levels of the plurality of reflected sounds identified by the identification section in combination.

3. The sound field controller as claimed in claim 1, wherein when the ratio is regarded as a first coefficient and a sound pressure level ratio between a direct sound and a reflected sound collected or assumed in another reproduction environment which differs from the reproduction environment is regarded as a second coefficient, the adjustment section adjusts the effect sound signal using a ratio of the second coefficient to the first coefficient.

4. The sound field controller as claimed in claim 2, wherein when the ratio is regarded as a first coefficient and a sound pressure level ratio between a direct sound and a reflected sound collected or assumed in another reproduction environment which differs from the reproduction environment is regarded as a second coefficient, the adjustment section adjusts the effect sound signal using a ratio of the second coefficient to the first coefficient.

5. The sound field controller as claimed in claim 1, further comprising a setting section for setting the time period.

6. The sound field controller as claimed in claim 1, wherein the identification section identifies the maximum reflected sound in a first time period after an elapse of a second time period from the collecting timing of the direct sound.

7. The sound field controller as claimed in claim 1, wherein the identification section identifies the maximum reflected sound from, except for primary reflected sounds, secondary or subsequent reflected sounds contained in the measurement signal acquired by the acquisition section.

8. The sound field controller as claimed in claim 1, wherein an amount of adjustment to the effect sound signal by the adjustment section changes in response to a magnitude of the ratio of the sound pressure level of the direct sound to the sound pressure level of the maximum reflected sound.

9. The sound field controller as claimed in claim 8, wherein the adjustment section increases the amount of adjustment to the effect sound signal as the ratio decreases, and decreases the amount of adjustment to the effect sound signal as the ratio increases.

* * * * *